(12) United States Patent
Yang et al.

(10) Patent No.: US 8,878,220 B2
(45) Date of Patent: Nov. 4, 2014

(54) LIGHT EMITTING DIODE WITH IMPROVED LUMINOUS EFFICIENCY

(75) Inventors: Jeong Hee Yang, Ansan-si (KR); Kyoung Wan Kim, Ansan-si (KR); Yeo Jin Yoon, Ansan-si (KR); Ye Seul Kim, Ansan-si (KR); Sang Hyun Oh, Ansan-si (KR); Duk Il Suh, Ansan-si (KR); Keum Ju Lee, Ansan-si (KR); Jin Woong Lee, Ansan-si (KR); Da Yeon Jeong, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 186 days.

(21) Appl. No.: 13/209,765

(22) Filed: Aug. 15, 2011

(65) Prior Publication Data
US 2012/0049223 A1 Mar. 1, 2012

(30) Foreign Application Priority Data

Aug. 27, 2010 (KR) .................. 10-2010-0083480
Oct. 1, 2010 (KR) .................. 10-2010-0096016

(51) Int. Cl.
*H01L 33/00* (2010.01)
*H01L 33/38* (2010.01)
*H01L 33/20* (2010.01)
*H01L 33/42* (2010.01)

(52) U.S. Cl.
CPC .......... *H01L 33/38* (2013.01); *H01L 33/20* (2013.01); *H01L 2933/0091* (2013.01); *H01L 33/42* (2013.01)
USPC .................................... 257/99; 257/E33.065

(58) Field of Classification Search
USPC ................................................ 257/98, 99
See application file for complete search history.

(56) References Cited

U.S. PATENT DOCUMENTS 6,657,236 B1 * 12/2003 Thibeault et al. ............ 257/98
7,317,212 B2 * 1/2008 Shin ............................ 257/98
(Continued)

FOREIGN PATENT DOCUMENTS

KR 1020060065869 6/2006
KR 1020090049065 5/2009
(Continued)

OTHER PUBLICATIONS

International Search Report dated Apr. 4, 2012 for PCT/KR2011/005872.

*Primary Examiner* — Benjamin Sandvik
(74) *Attorney, Agent, or Firm* — H.C. Park & Associates, PLC

(57) ABSTRACT

Exemplary embodiments of the present invention relate to light emitting diodes. A light emitting diode according to an exemplary embodiment of the present invention includes a substrate having a first side edge and a second side edge, and a light emitting structure arranged on the substrate. The light emitting structure includes a first conductivity-type semiconductor layer, an active layer, and a second conductivity-type semiconductor layer. A transparent electrode layer including a concave portion and a convex portion is arranged on the second conductivity-type semiconductor layer. A first electrode pad contacts an upper surface of the first conductivity-type semiconductor layer and is located near a center of the first side edge. Two second electrode pads are located near opposite distal ends of the second side edge to supply electric current to the second conductivity-type semiconductor layer. A first pad extension extends from the first electrode pad and a second pad extension extends from each of the two second electrode pads.

12 Claims, 10 Drawing Sheets

(56) References Cited

U.S. PATENT DOCUMENTS

| | | | |
|---|---|---|---|
| 8,110,847 B2 * | 2/2012 | Ko et al. | 257/99 |
| 8,212,276 B2 * | 7/2012 | Gong | 257/99 |
| 8,378,373 B2 * | 2/2013 | Wang et al. | 257/99 |
| 2008/0296602 A1 * | 12/2008 | Liu | 257/99 |
| 2008/0308833 A1 * | 12/2008 | Moriyama et al. | 257/99 |
| 2009/0026476 A1 * | 1/2009 | Tazima et al. | 257/98 |
| 2009/0159909 A1 * | 6/2009 | Lee et al. | 257/96 |
| 2010/0006885 A1 * | 1/2010 | Gong | 257/99 |
| 2010/0044744 A1 | 2/2010 | Kim et al. | |

FOREIGN PATENT DOCUMENTS

| | | |
|---|---|---|
| KR | 1020090049691 | 5/2009 |
| KR | 1020090105490 | 10/2009 |
| KR | 1020100002485 | 1/2010 |

* cited by examiner (a)

(b)

(c)

LIGHT EMITTING DIODE WITH IMPROVED LUMINOUS EFFICIENCY

CROSS-REFERENCE TO RELATED APPLICATIONS

This application claims priority from and the benefit of Korean Patent Application No. 10-2010-0083480, filed on Aug. 27, 2010 and Korean Patent Application No. 10-2010-0096016, filed on Oct. 1, 2010, which are hereby incorporated by reference for all purposes as if fully set forth herein.

BACKGROUND OF THE INVENTION

1. Field of the Invention

Exemplary embodiments of the invention relate to light emitting diodes and, more particularly, to light emitting diodes with improved luminous efficiency.

2. Discussion of the Background

Gallium nitride (GaN) based light emitting diodes (LEDs) have been used in a wide range of applications including natural color LED display devices, LED traffic sign boards, white LEDs, etc.

The GaN-based light emitting diode is generally formed by growing epitaxial layers on a substrate, for example, a sapphire substrate, and includes an n-type semiconductor layer, a p-type semiconductor layer, and an active layer interposed between the n-type semiconductor layer and the p-type semiconductor layer. Further, an N electrode pad is formed on the n-type semiconductor layer and a P electrode pad is formed on the p-type semiconductor layer. The light emitting diode is electrically connected to and operated by an external power source through these electrode pads. Here, electric current may be directed from the P-electrode pad to the N-electrode pad through the semiconductor layers.

Generally, since the p-type semiconductor layer may have high specific resistance, electric current may not be evenly distributed in the p-type semiconductor layer, but may be concentrated on a portion of the p-type semiconductor layer having the P-electrode formed thereon, and may cause a problem of current crowding at an edge of the p-type semiconductor layer. Current crowding may lead to a reduction in light emitting area, thereby deteriorating luminous efficiency. To solve such problems, a transparent electrode layer having low specific resistance may be formed on the p-type semiconductor layer so as to enhance current spreading. However, despite excellent electrical conductivity of the transparent electrode layer, current crowding may occur near the electrode pad, and although the transparent electrode layer may induce some degree of reflection or refraction of light, optical loss may occur due to total internal reflection caused by a difference in refractive index between the transparent electrode layer and the exterior.

In this general structure, electric current supplied from the P-electrode pad may be dispersed by the transparent electrode layer before entering the p-type semiconductor layer, thereby increasing a light emitting area of the LED. However, since the transparent electrode layer may absorb light, the thickness of the transparent electrode layer is limited, thereby providing limited current spreading. In particular, in a large-scale LED having an area of about 1 mm$^2$ or more, there may be a limit in achieving efficient current spreading through the transparent electrode layer.

To assist current spreading, a large-scale LED may include pad extensions extending from the electrode pads. For example, U.S. Patent Application Publication No. 2010/0044744, applied for by Kim, et al., discloses an LED which includes pad extensions to enhance current spreading. Conventionally, the LED is provided at an upper side thereof with a transparent electrode layer in addition to the pad extensions for current spreading. The transparent electrode layer assists current spreading in cooperation with the pad extensions.

However, pad extensions and a plurality of n-electrode pads occupying a relatively large area are generally formed by etching an active layer and an upper semiconductor layer which have a relatively wide area. Accordingly, the formation of the n-electrode pad and the pad extensions may result in a reduction in light emitting area, causing deterioration in light emitting efficiency. Alternatively, although the LED may include a plurality of n- and p-electrode pads to assist current spreading, the formation of the plural electrode pads may lead to an increase in the number of processes such as a wire-bonding process, thereby decreasing package yield. Furthermore, since the n-electrode pad and the p-electrode pad are disposed to face each other, current crowding is likely to occur between adjacent electrode pads, thereby causing uneven light emission from a central region of the light emitting diode.

On the other hand, a patterned sapphire substrate may be used to improve LED light extraction efficiency. The pattern on the sapphire substrate scatters or reflects light generated in the active layer to reduce optical loss due to total internal reflection inside the LED, thereby improving light extraction efficiency.

Although improvement in light extraction efficiency may be achieved by use of the patterned sapphire substrate, the relatively high refractive index of the GaN-based compound semiconductor may result in optical loss by total internal reflection inside the LED.

SUMMARY OF THE INVENTION

Exemplary embodiments of the present invention provide a light emitting diode which has improved luminous efficiency.

Exemplary embodiments of the present invention also provide a light emitting diode which permits uniform current spreading without reducing a light emitting area.

Exemplary embodiments of the present invention provide a light emitting diode which has improved light extraction efficiency.

Additional features of the invention will be set forth in the description which follows, and in part will be apparent from the description, or may be learned by practice of the invention.

An exemplary embodiment of the present invention discloses a light emitting diode including a substrate having a first side edge and a second side edge. A light emitting structure is arranged on the substrate. The light emitting structure includes a first conductivity-type semiconductor layer, an active layer, and a second conductivity-type semiconductor layer. Further, a transparent electrode layer is arranged on the second conductivity-type semiconductor layer. The transparent electrode layer may have a concave portion and a convex portion. A first electrode pad contacts an upper surface of the first conductivity-type semiconductor layer and is located near a center of the first side edge. Further, two second electrode pads are located near opposite distal ends of the second side edge to supply electric current to the upper semiconductor layer. In addition, a first pad extension extends from the first electrode pad and a second pad extension extends each of from the two second electrode pads.

An exemplary embodiment of the present invention also discloses a method of fabricating an LED. The method includes forming epitaxial layers on a substrate, the epitaxial layers including a first conductivity-type semiconductor layer, an active layer, and a second conductivity-type semiconductor layer, etching the epitaxial layers to expose first regions of the first conductivity-type semiconductor layer, forming a lower transparent electrode layer on the epitaxial layers, etching the lower transparent electrode layer to form nanoparticles on the second conductivity-type semiconductor layer, forming an upper transparent electrode layer to cover the nanoparticles, forming a first electrode pad and first pad extensions on the first regions of the first conductivity-type semiconductor layer, and forming two second electrode pads and second pad extensions on the transparent electrode layer.

An exemplary embodiment of the present invention also discloses a method of fabricating an LED. The method includes forming epitaxial layers on a substrate, the epitaxial layers including a first conductivity-type semiconductor layer, an active layer, and a second conductivity-type semiconductor layer, etching the epitaxial layers to expose first regions of the first conductivity-type semiconductor layer, forming a transparent electrode layer on the epitaxial layers, patterning the transparent electrode layer to form holes exposing the second conductivity-type semiconductor layer, forming an insulation layer to cover the transparent electrode layer, patterning the insulation layer to form micro-lenses arranged in the holes, forming a first electrode pad and first pad extensions on the first regions of the first conductivity-type semiconductor layer, and forming two second electrode pads and second pad extensions on the transparent electrode layer.

An exemplary embodiment of the present invention also discloses a light emitting diode including a substrate, a light emitting structure arranged on the substrate and including a first conductivity-type semiconductor layer, an active layer, and a second conductivity-type semiconductor layer, a transparent electrode layer arranged on the second conductivity-type semiconductor layer and including an upper convex-concave surface having a plurality of concave portions, and a plurality of micro-lenses arranged on the transparent electrode layer and covering the transparent electrode layer concave portions.

An exemplary embodiment of the present invention also discloses a method of fabricating an LED including forming epitaxial layers on a substrate, the epitaxial layers including a first conductivity-type semiconductor layer, an active layer, and a second conductivity-type semiconductor layer, etching the epitaxial layers to expose first regions of the first conductivity-type semiconductor layer, forming a transparent electrode layer on the epitaxial layers, forming a convex-concave surface on the transparent electrode layer, the convex-concave surface including a plurality of concave portions, and forming a plurality of micro-lenses made of a transparent material, the micro-lenses covering the concave portions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
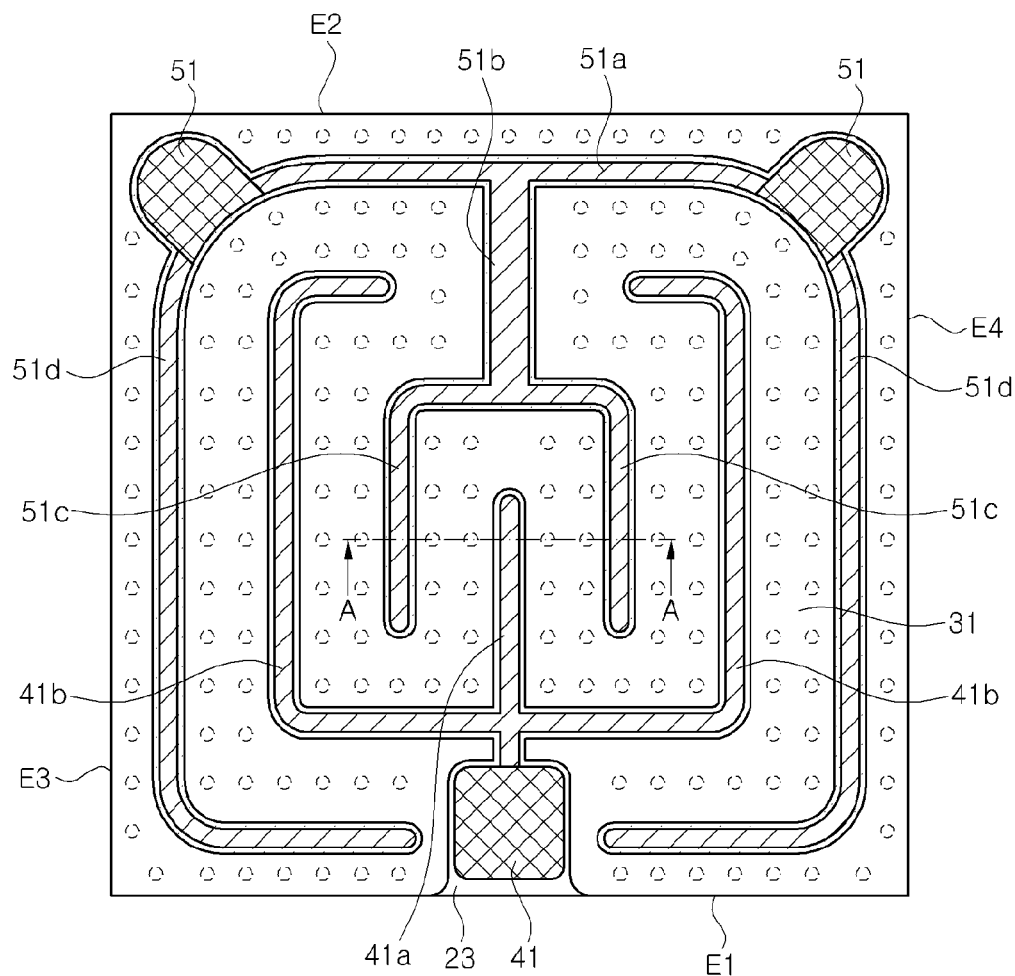
FIG. 1 is a plan view of a LED according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
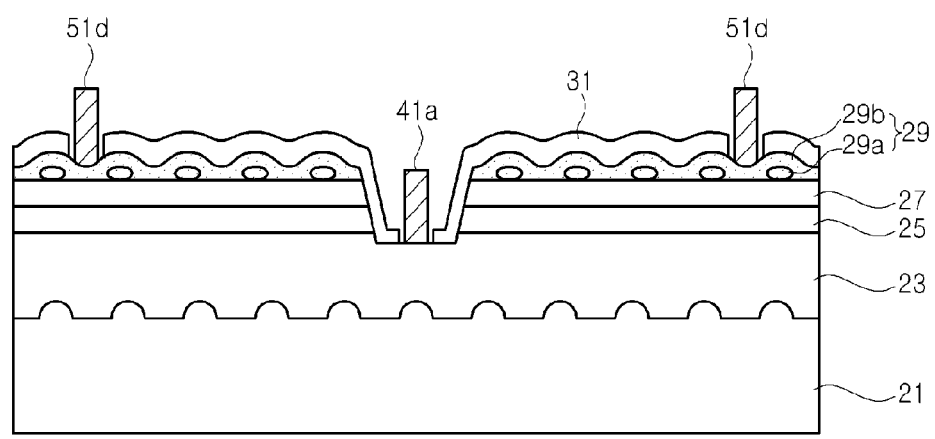
FIG. 2 is a side-sectional view taken along line A-A of FIG. 1.

FIG. 1 is a plan view of a light emitting diode according to an exemplary embodiment of the present invention and FIG. 2 is a side-sectional view taken along line A-A of FIG. 1.

Referring to FIGS. 1 and 2, the light emitting diode includes a substrate 21, a light emitting structure, a transparent electrode layer 29, a first electrode pad 41 and a second electrode pad 51, a first pad extension 41a and 41b, and a second pad extension 51a, 51b, 51c, and 51d. Further, the LED may include an insulation layer 31. In addition, the light emitting structure includes a first conductivity-type lower semiconductor layer 23, an active layer 25, and a second conductivity-type upper semiconductor layer 27. The transparent electrode layer 29 includes nanoparticles 29a and an upper transparent electrode layer 29b.

The substrate 21 may be a patterned sapphire substrate. The substrate 21 includes a first side edge E1 and a second side edge E2 facing each other at opposite sides of the substrate 21. In addition, the substrate 21 may have a rectangular shape. Thus, the substrate 21 may have a third side edge E3 and a fourth side edge E4, which connect the first side edge E1 and the second side edge E2.

The first conductivity-type semiconductor layer 23 is located on the substrate 21 and the second conductivity-type semiconductor layer 27 is located on the first conductivity-type semiconductor layer 23 with the active layer 25 interposed between the first and second conductivity-type semiconductor layers 23 and 27. The first conductivity-type semiconductor layer 23, active layer 25 and second conductivity-type semiconductor layer 27 may be formed of a GaN-based compound semiconductor material such as (Al, In, Ga)N. The active layer 25 is composed of elements emitting light at a desired wavelength, for example, ultraviolet (UV) or blue light.

The first conductivity-type semiconductor layer 23 may be an n-type nitride semiconductor layer and the second conductivity-type semiconductor layer 27 may be a p-type nitride semiconductor layer, or vice versa.

As shown in the figures, the first conductivity-type semiconductor layer 23 and/or the second conductivity-type semiconductor layer 27 may have a single layer structure or a multilayer structure. Further, the active layer 25 may have a single quantum well structure or a multi-quantum well structure. The light emitting diode may further include a buffer layer (not shown) between the substrate 21 and the first conductivity-type semiconductor layer 23. These semiconductor layers 23, 25, 27 may be formed by metal-organic chemical vapor deposition (MOCVD) or molecular beam epitaxy (MBE).

The second conductivity-type upper semiconductor layer 27 and active layer 25 of the light emitting structure may be divided to define at least two light emitting areas. These light emitting areas may have a symmetrical structure and division thereof may be carried out by mesa-etching. The first conductivity-type lower semiconductor layer 23 in a region crossing the center of the light emitting structure may be exposed by mesa-etching, so that the second conductivity-type upper semiconductor layer 27 and the active layer 25 are divided into two areas.

Further, in the light emitting structure, some regions of the first conductivity-type lower semiconductor layer 23 may be exposed by mesa-etching to form the first electrode pad 41 and the first pad extension 41a, 41b.

The transparent electrode layer 29 is located on the second conductivity-type semiconductor layer 27. The transparent electrode layer 29 may be formed of indium tin oxide (ITO) or Ni/Au and forms an ohmic contact with the second conductivity-type semiconductor layer 27. The transparent electrode layer 29 may include the nanoparticles 29a and the upper transparent electrode layer 29b covering the nanoparticles 29a. The nanoparticles 29a provide a convex-concave surface to the upper transparent electrode layer 29b. The nanoparticles 29a may have a substantially spherical shape, and the upper transparent electrode layer 29b has concave portions and convex portions. With this configuration, the LED has improved light extraction efficiency.

The nanoparticles 29a may be uniformly or non-uniformly distributed. In addition, the nanoparticles 29a may be formed, for example, in an island shape. Alternatively, the nanoparticles may be formed in a stripe shape having a nanometer scale width.

The insulation layer 31 covers the transparent electrode layer 29. The insulation layer 31 may also cover sidewalls of the second conductivity-type upper semiconductor layer 27 and the active layer 25 exposed by mesa-etching, that is, mesa-sides thereof exposed by the mesa-etching. The insulation layer 31 may be formed along the convex-concave surface of the transparent electrode layer 29 to form a convex-concave surface, thereby reducing total internal reflection of light emitted through the insulation layer 31 in the LED. The insulation layer 31 may be formed of any insulating material, for example $SiO_2$, so long as light generated in the active layer 25 can pass through the insulating material.

Further, the insulation layer 31 has an opening, through which the transparent electrode layer 29 is exposed, such that the second pad extensions 51a, 51b, 51c, and 51d are formed in the opening to be connected to the transparent electrode layer 29. In addition, the second electrode pads 51 may also be formed in the opening of the insulation layer 31 to be brought into direct contact with the transparent electrode layer 29.

The single first electrode pad 41 and the first pad extensions 41a and 41b are located on the exposed region of the first conductivity-type lower semiconductor layer 23 subjected to mesa etching. The first electrode pad 41 contacts an upper surface of the lower semiconductor layer 23 and is located near the center of the first side edge E1. Namely, the first electrode pad 41 may be located on a straight line connecting the center of the first side edge E1 and the center of the substrate 21, to be closer to the first side edge E1 than the center of the substrate 21, when seen in plan view. The center of the first electrode pad 41 may be located at the center of the straight line.

The first pad extension includes a first inserting portion 41a and a second inserting portion 41b. The first inserting portion 41a extends from the first electrode pad 41 towards the second side edge E2. When seen in plan view, the first inserting portion 41a may cross the center of the substrate 21 and have a distal end closer to the center of the substrate 21 than to the second side edge E2. The second inserting portions 41b extend from a portion of the first inserting portion 41a between the center of the first inserting portion 41a and the first electrode pad 41 towards opposite sides of the first inserting portion 41a along the first side edge E1, are bent to extend towards the second side edge E2, and further bent to extend towards each other. Here, distal ends of the second inserting portions 41b do not meet each other. A distance between the distal ends of the second inserting portions 41b may be the same as the length of a portion of each of the second inserting portions 41b extending from the first inserting portion 41a along the first side edge E1. In addition, the distance from a line that connects the distal ends of the second inserting portions 41b to each other, to the center of the substrate 21 may be the same as the distance from the center of the substrate 21 to a portion of the first inserting portion 41a, from which the second inserting portion 41a extends.

The two second electrode pads 51 are located near opposite ends of the second side edge E2, respectively. Each of the second electrode pads 51 is located on a straight line, which connects one end of the second side edge E2 to the center of the substrate 21, and each of the second electrode pads 51 are closer to one end of the second side edge E2 than to the center of the substrate 21. In addition, the center of the second electrode pad 51 may be located on the straight line. Further, the first electrode pad 41 and the two second electrode pads 51 may be located at vertices of an isosceles triangle, respectively.

The second pad extension includes a connecting portion 51a, a first inserting portion 51b, second inserting portions 51c, and third inserting portions 51d. The connecting portion 51a connects the two second electrode pads 51 to each other. The connecting portion 51a extends along the second side edge E2. The first inserting portion 51b extends from a central region of the connecting portion 51a towards the first side edge E1. The first inserting portion 51b may be located on an imaginary elongated line of the first inserting portion 41a of the first pad extension. A distal end of the first inserting portion 51b is separated from the distal end of the first inserting portion 41a of the first pad extension. Since the first inserting portion 51b receives electric current supplied from the two second electrode pads 51, the first inserting portion 51b may be formed to have a greater width than the connecting portion 51a or other inserting portions 51c, 51d in consideration of current density.

The second inserting portions 51c extend from the distal end of the first inserting portion 51b parallel to the second side edge E2 and are then bent to extend towards the first side edge E1 to surround the distal end of the first pad extension first inserting portion 41a. Each of the second inserting portions 51c extends towards a region between the first and second inserting portions 41a, 41b of the first pad extension.

The third inserting portion 51d extends from each of the two electrode pads 51 towards the first side edge E1 and is bent to extend towards the first electrode pad 41 along the first side edge E1.

As shown in FIG. 1, the first pad extension and the second pad extension may be disposed to have a symmetrical structure with respect to a vertical plane taken along the first inserting portion 41a of the first pad extension and the first inserting portion 51b of the second pad extension, so that the LED demonstrates the same current spreading characteristics at both sides of the vertical plane.

In addition, the first and second pad extensions are alternately disposed at either side of the first inserting portion 41a with respect to the center of the substrate 21 such that the distance between the first and second pad extensions in one region on the substrate 21 is substantially the same as the distance therebetween in other regions on the substrate 21, thereby enabling uniform current spreading over a wide area of the LED.

In the present exemplary embodiment, although the second electrode pad 51 is illustrated as being formed on the transparent electrode layer 29, the second electrode pad 51 is provided to supply electric current to the upper semiconductor layer 27 and is not necessarily formed only on the transparent electrode layer 29. That is, the second electrode pad 51 may be formed at any location on the substrate 21 so long as the second electrode pad 51 is insulated from the first conductivity-type lower semiconductor layer 23. For example, the second electrode pad 51 may be located on a region of the substrate 21 exposed by etching the first conductivity-type lower semiconductor layer 23, or located on the first conductivity-type lower semiconductor layer 23 or the transparent electrode layer 29, with an insulation layer, for example, the insulation layer 31, interposed between the second electrode pad 51 and the first conductivity-type lower semiconductor layer 23 or the transparent electrode layer 29. It is possible to prevent current crowding near the electrode pads 51 by preventing the second electrode pad 51 from directly contacting the transparent electrode layer 29.

FIG. 3 to FIG. 6 are sectional views explaining a method of fabricating an LED in accordance with one exemplary embodiment of the invention.

Figure 3:
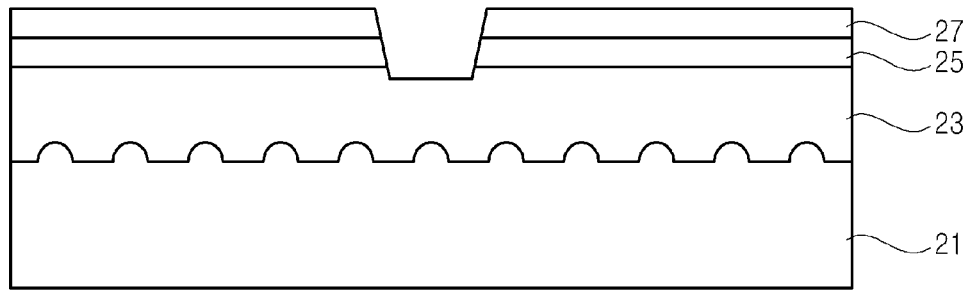
FIG. 3 to FIG. 6 are side-sectional views explaining a method of fabricating an LED according to one exemplary embodiment of the present invention.

Referring to FIG. 3, epitaxial layers including a first conductivity-type lower semiconductor layer 23, an active layer 25 and a second conductivity-type upper semiconductor layer 27 are grown on a substrate 21. The epitaxial layers 23, 25, 27 may be formed by metal-organic chemical vapor deposition (MOCVD) or molecular beam epitaxy (MBE). A buffer layer (not shown) may be formed before growing the first conductivity-type lower semiconductor layer 23.

Then, the epitaxial layers 23, 25, 27 are subjected to mesa etching to expose some regions of the first conductivity-type lower semiconductor layer 23. The epitaxial layers 23, 25, 27 may be subjected to patterning through photolithography and etching.

Figure 4:
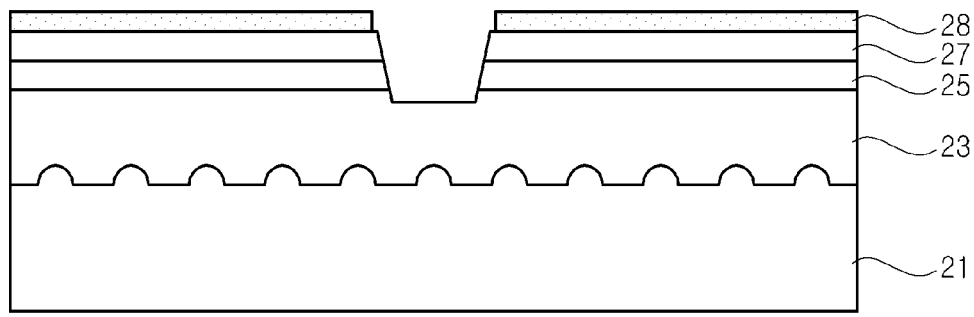

Referring to FIG. 4, a lower transparent electrode layer 28 is formed on the epitaxial layers. The lower transparent electrode layer 28 may be formed of a transparent conductive oxide such as indium tin oxide (ITO) or zinc oxide (ZnO) by a lift-off process.

Figure 5:
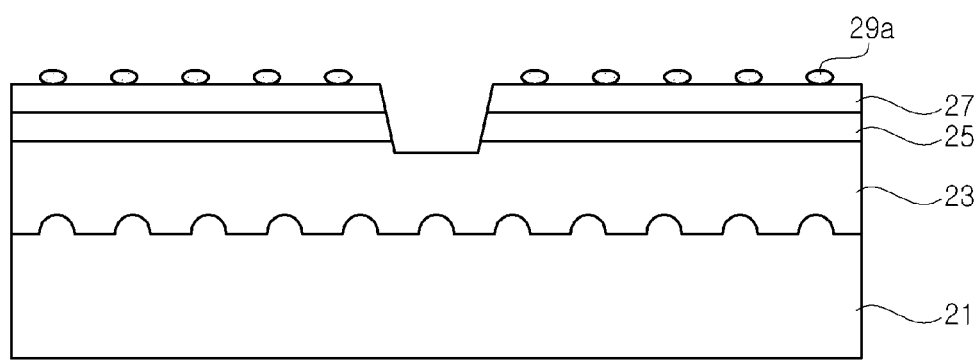

Referring to FIG. 5, the lower transparent electrode layer 28 is subjected to patterning by wet etching or by lithography and etching to form nanoparticles 29a. The nanoparticles 29a may be separated from each other and distributed in an island shape on the second conductivity-type upper semiconductor layer 27. Alternatively, some of the nanoparticles 29a may have a stripe shape having a nanoscale width.

When the lower transparent electrode layer 28 is wet etched, the lower transparent electrode layer 28 may be etched using a strong acid, such as hydrochloric acid, sulfuric acid, or phosphoric acid, instead of using a photoresist. The lower transparent electrode layer 28 is partially rapidly etched by the strong acid, thereby forming spherical nanoparticles 29a. Since the strong acid may remove foreign substances from mesa sidewalls or an exposed upper surface of the first conductivity-type lower semiconductor layer 23, the LED has improved electrical properties.

Figure 6:
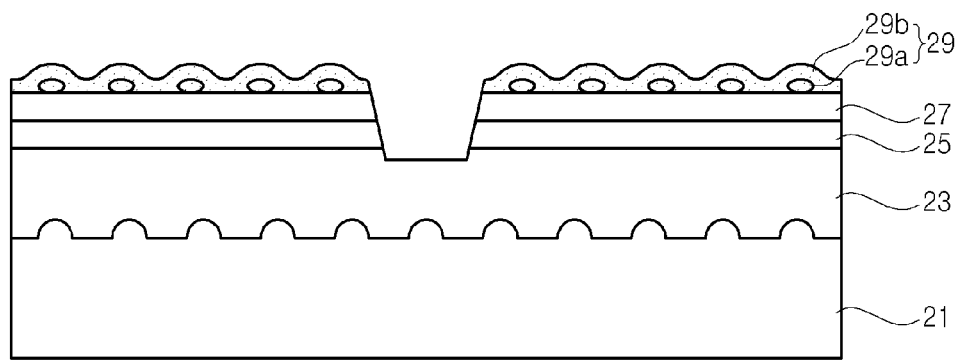

Referring to FIG. 6, an upper transparent electrode layer 29b is formed on the second conductivity-type upper semiconductor layer 27 having the nanoparticles 29a formed thereon. The upper transparent electrode layer 29b may be formed by a lift-off process and deposited corresponding to the shapes of the nanoparticles 29a, so that the surface of the upper transparent electrode layer 29b has a convex-concave surface. Accordingly, a transparent electrode layer 29 having a convex-concave surface is completed.

Then, an insulation layer 31 is formed and patterned to form openings for exposing the first conductivity-type lower semiconductor layer 23 and the transparent electrode layer 29, at places where first and second electrode pads 41, 51 and first and second pad extensions will be formed. Then, a single first electrode pad 41 and a first pad extension 41a, 41b are formed on exposed regions of the lower semiconductor layer 23, and two second electrode pads 51 and second pad extensions 51a, 51b, 51c, and 51d are formed on the transparent electrode layer 29. Then, the semiconductor structure is divided into individual LEDs, thereby providing complete LEDs.

Figure 7:
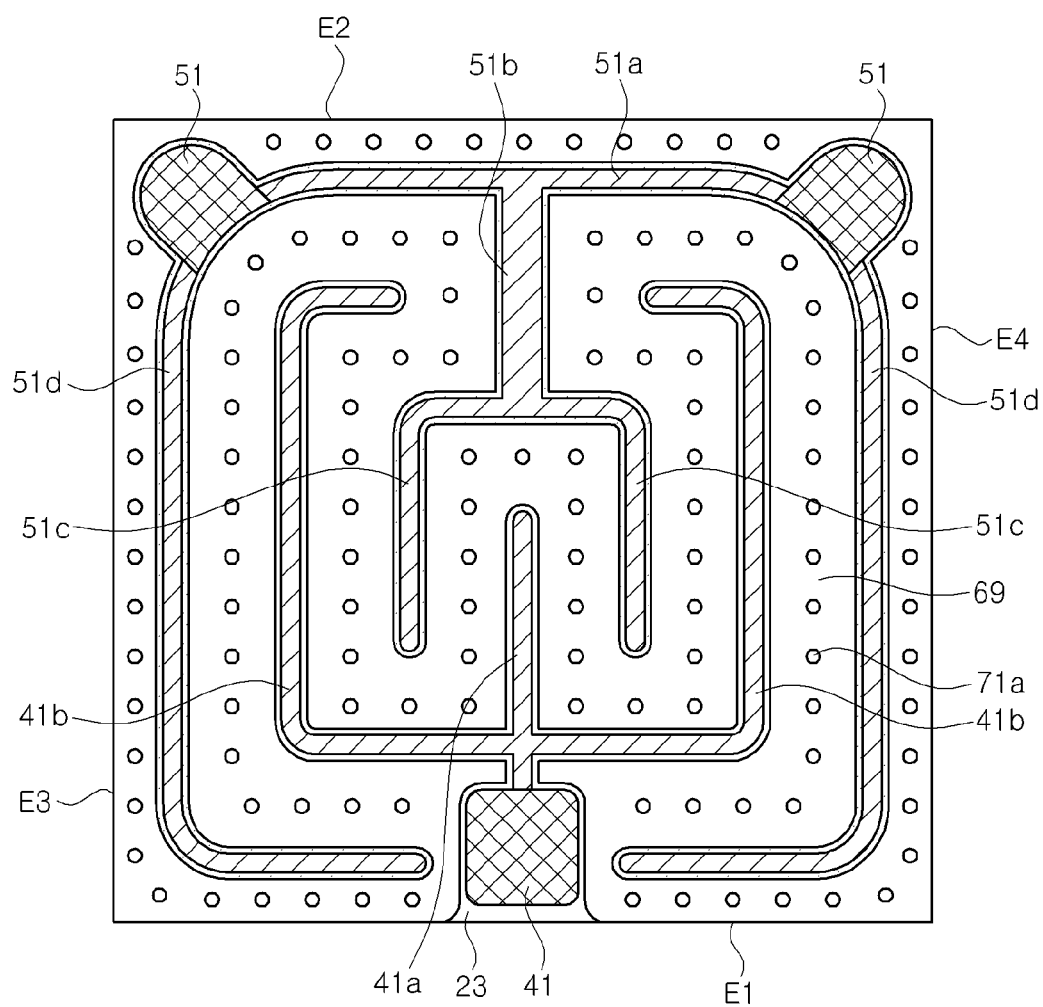
FIG. 7 is a plan view of an LED according to an exemplary embodiment of the present invention.
Figure 8:
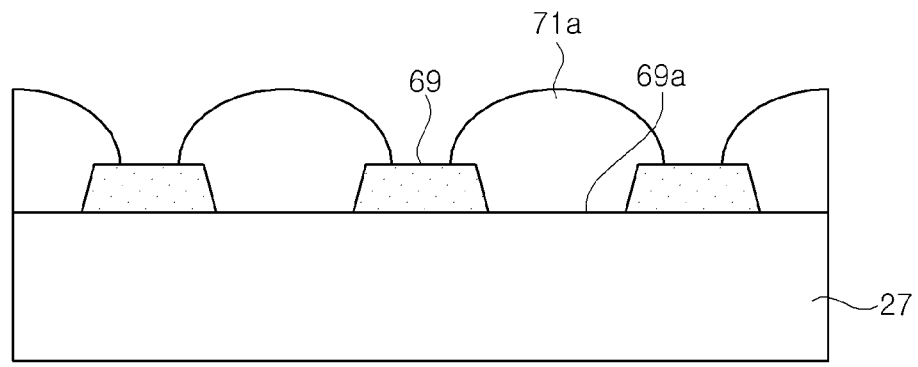
FIG. 8 is a partially enlarged side-sectional view of the LED of FIG. 7.

FIG. 7 is a plan view of an LED according to an exemplary embodiment of the present invention, and FIG. 8 is a partially enlarged side-sectional view of the LED.

Referring to FIGS. 7 and 8, the LED according to the present exemplary embodiment is generally similar to the LED of FIG. 1. In the LED of the present exemplary embodiment, however, a transparent electrode layer 69 has holes which expose an upper semiconductor layer 27, and microlenses 71 are located on the holes. Specifically, according to the present exemplary embodiment, concave portions of the transparent electrode layer 69 comprise holes 69a (see FIG.

9) and convex portions of the transparent electrode layer 69 have a mesh shape, and the micro-lenses 71a are disposed in the holes 69a instead of the insulation layer 31. In the present exemplary embodiment, although the holes 69a are illustrated as through-holes exposing a layer under the holes 69a, that is, the upper semiconductor layer 27, blind holes may also be used as in exemplary embodiments described below.

The holes 69a and the micro-lenses 71a may be regularly or irregularly located on the second conductivity-type upper semiconductor layer 27. The holes 69a may have a micrometer-scale diameter, for example, about 6 μm, and a distance between the holes may be about 8 μm. The holes 69a may have a circular or elliptical cross-section.

The micro-lenses 71a may have a semi-spherical convex surface to act as a convex lens. The micro-lenses 71a may have a micrometer-scale diameter, for example, about 9 μm, in a horizontal direction. The transparent electrode layer 69 may be formed of ZnO or ITO, and the micro-lenses 71a may be formed of a material, for example $SiO_2$, which has a lower refractive index than the transparent electrode layer 69.

As the transparent electrode layer 69 is formed with the holes 69a and the micro-lenses 71a are located in the holes, light generated in the active layer 25 may be emitted to the outside through the micro-lenses 71a, thereby improving light extraction efficiency. Furthermore, in the exemplary embodiment described above, an interface is formed between the transparent electrode layer 29 and the insulation layer 31 and total internal reflection may occur at this interface, thereby causing optical loss. On the contrary, in the present exemplary embodiment, since an interface between the transparent electrode layer 69 and the micro-lenses 71a is reduced, optical loss occurring at the interface therebetween may be lowered.

Figure 9:
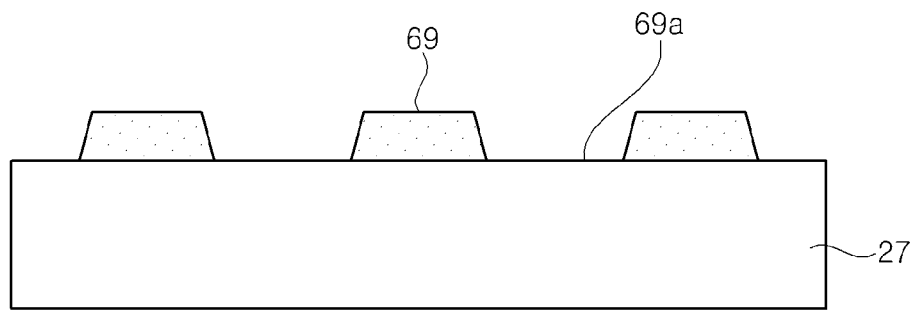
FIGS. 9 and 10 are side-sectional views explaining a method of fabricating the LED shown in FIGS. 7 and 8.
Figure 10:
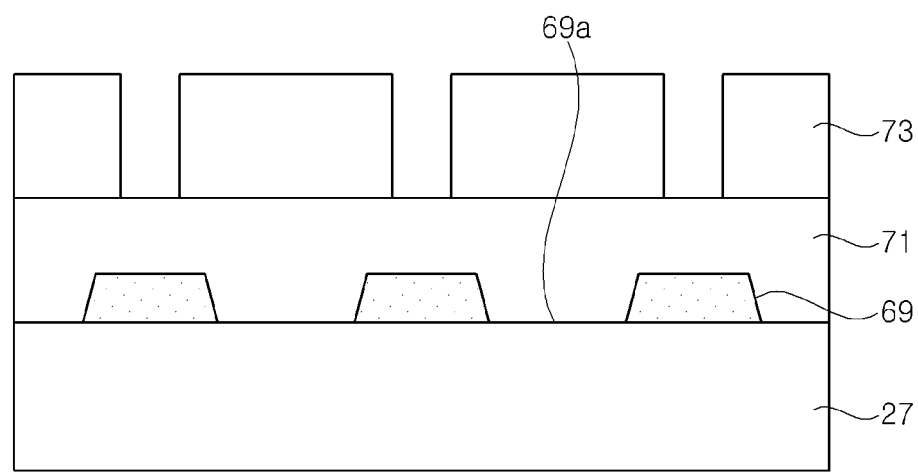

FIGS. 9 and 10 are side-sectional views explaining a method of fabricating the LED described above according to the present exemplary embodiment.

Referring to FIG. 9, epitaxial layers 23, 25, and 27 are formed on a substrate 21 and subjected to mesa-etching to expose some regions of the first conductivity-type lower semiconductor layer 23, as described in the above exemplary embodiment of FIG. 3. Then, a transparent electrode layer 69 having holes 69a is formed on a second conductivity-type upper semiconductor layer 27. The transparent electrode layer 69 and the holes 69a may be formed at the same time by forming a photoresist pattern corresponding to a pattern of the holes 69a to be formed thereon and performing a lift-off process. Alternatively, after forming a transparent conductive layer 69 on the second conductivity-type upper semiconductor layer 27, the transparent conductive layer 69 may be subjected to patterning by lithography and etching to form the holes 69a.

Referring to FIG. 10, an insulation layer 71 is formed to cover the transparent conductive layer 69. The insulation layer 71 may cover mesa sidewalls and some regions of the first conductivity-type lower semiconductor layer 23 exposed by mesa etching. The insulation layer 71 may be formed of $SiO_2$.

Then, a photoresist pattern 73 is formed on the insulation layer 71. The photoresist pattern 73 coves the insulation layer 71 on the holes 69a and has openings which expose the insulation layer 71 on the transparent electrode layer 69.

Then, the insulation layer 71 is etched by wet etching to form micro-lenses 71a as shown in FIG. 8. Alternatively, the photoresist pattern 73 may be formed to have lens shapes using a reflow technology and may be used as a mask for dry etching the insulation layer 71 to form the micro-lenses 71a.

Figure 11:
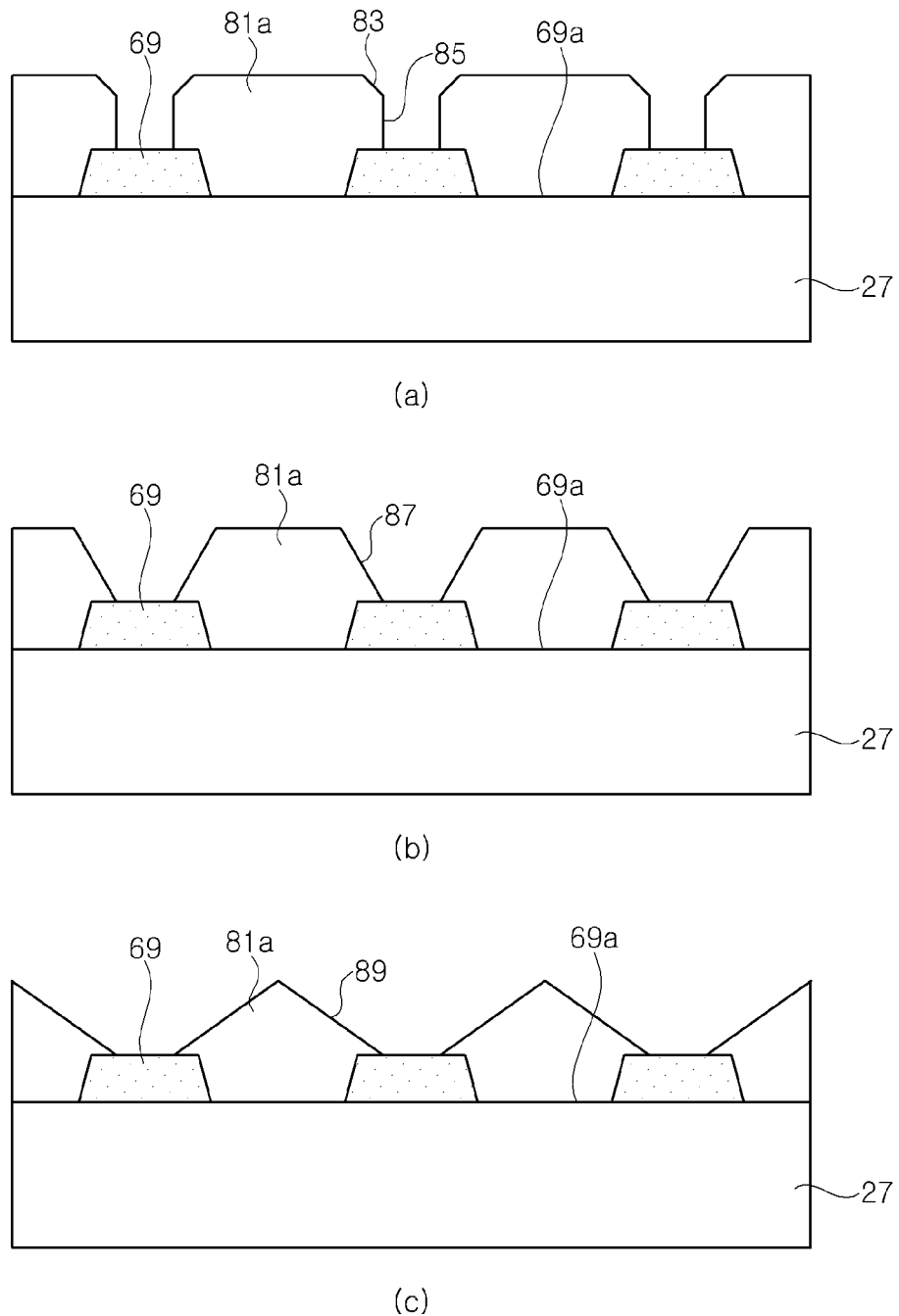
FIGS. 11(a), 11(b), and 11(c) show side-sectional views of various micro-lenses formed on a transparent electrode layer including through-holes, according to exemplary embodiments of the present invention.
Figure 12:
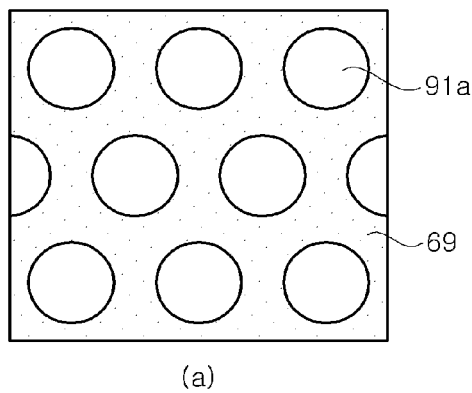
FIGS. 12(a), 12(b), and 12(c) show plan views of various micro-lenses according to exemplary embodiments of the present invention.
Figure 12:
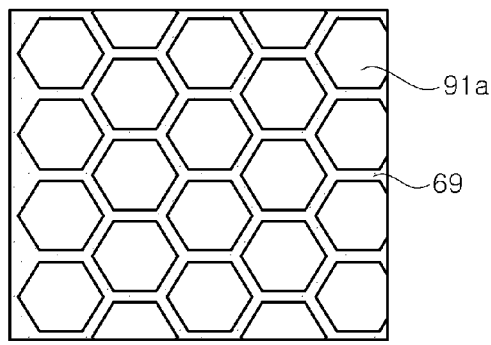
Figure 12:
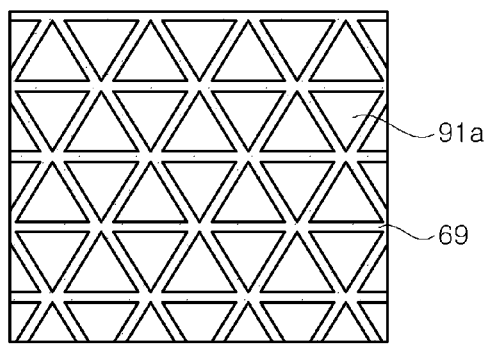

FIGS. 11 and 12 are a side sectional view and a plan view of various micro-lenses formed on a transparent electrode layer including through-holes.

Although the micro-lenses 71a in FIG. 8 are illustrated as having a vertical cross-section of a convex shape, for example, a circular or elliptical cross-sectional shape on the transparent electrode layer 69, the micro-lenses 71a may have various shapes. These micro-lenses 71a generally have a vertical cross section, a width of which gradually decreases upwards, on the transparent electrode layer 69.

Referring to FIG. 11(a), micro-lenses 81a have a vertical cross-section, which includes a flat upper surface and side surfaces, on the transparent electrode layer 69, in which each of the side surfaces may comprise two inclined surfaces 83 and 85. Here, on the side surface of the micro-lens 81a, an obtuse angle may be defined between the inclined surfaces 83, 85. The inclined surface 85 may extend vertically on the transparent electrode layer 69. Alternatively, the inclined surface 85 may extend upwards on the transparent electrode layer 69 at a more inclined angle than the inclined surface 83.

Further, the side surface of the micro-lens 81a may include more than two inclined surfaces. In addition, at least one of the inclined surfaces 83, 85 may be a convex surface.

Further, as shown in FIG. 11(b), the micro-lenses 81a may have a flat upper surface and side surfaces, each of which comprises a single inclined surface. In addition, as shown in FIG. 11(c), the micro-lenses 81a may have side surfaces, each of which comprises a single inclined surface and meet other side surfaces to form a pointed end. The single inclined surface of the micro-lens 81a may be a flat surface. Alternatively, the single inclined surface of the micro-lens 81a may be a convex surface.

As shown in FIG. 12(a), micro-lenses 91a may have a circular or elliptical shape, when seen in plan view. That is, the micro-lens may have a horizontal cross-section of a circular or elliptical shape. The horizontal cross-section of the micro-lens 91a may have a hexagonal shape, a triangular shape, or a rectangular shape, as shown in FIGS. 12(b) and 12(c). Particularly, when the horizontal cross-section of the micro-lens has a hexagonal shape or a triangular shape, it is possible to dispose the micro-lenses 91a in a more dense arrangement.

The shapes of the micro-lenses may be variously selected through a suitable combination of horizontal cross-sectional shapes and vertical cross-sectional shapes in consideration of ease in fabrication, light extraction efficiency, and the like. For example, when the micro-lens has a vertical cross-section of a triangular shape as shown in FIG. 11(c) and a horizontal cross-section of a triangular shape as shown in FIG. 12(c), the micro-lens may have a triangular pyramidal shape, that is, a tetrahedral shape. As a result, light extraction efficiency may be improved and light entering the micro-lenses may be more easily emitted to the outside.

Next, a light emitting diode according to an exemplary embodiment of the present invention will be described. In description of the present exemplary embodiment, detailed description of components described above will be omitted herein.

Figure 13:
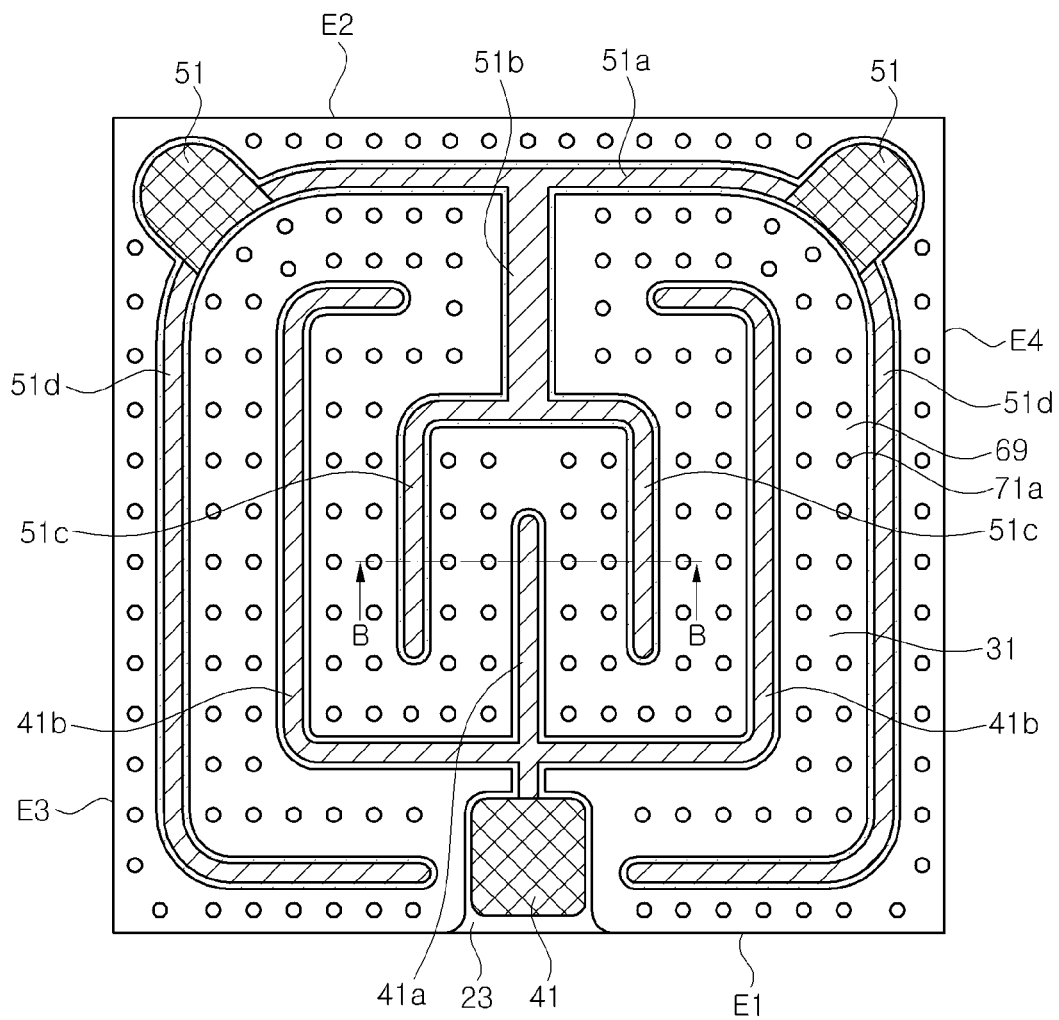
FIG. 13 is a plan view of a light emitting diode according to another exemplary embodiment of the present invention.
Figure 14:
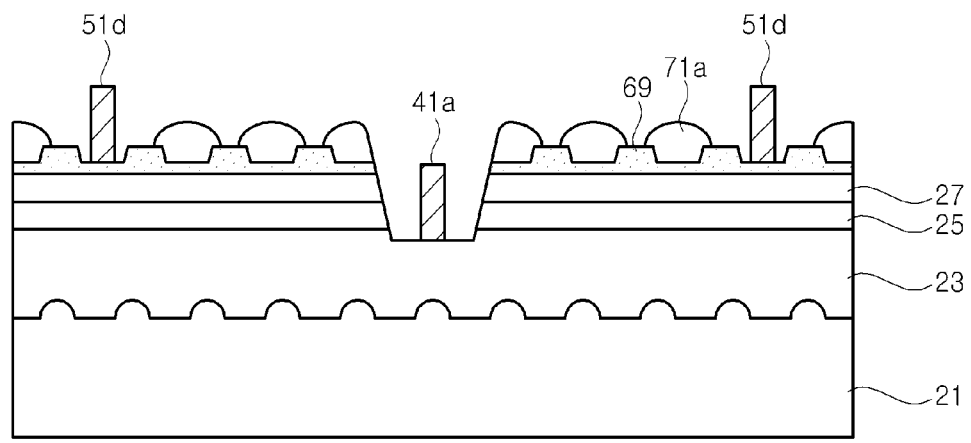
FIG. 14 is a side-sectional view of the LED taken along line B-B of FIG. 13.
Figure 15:
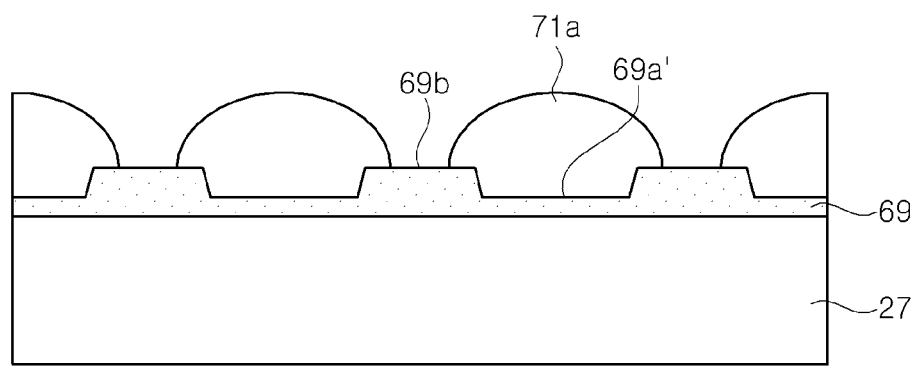
FIG. 15 is an enlarged side-sectional view of an upper portion of the LED of FIG. 14.

FIG. 13 is a plan view of a light emitting diode according to an exemplary embodiment of the present invention, FIG. 14 is a side-sectional view of the LED taken along line B-B of FIG. 13, and FIG. 15 is an enlarged side-sectional view of an upper portion of the LED of FIG. 14.

Referring to FIGS. 13 and 14, the light emitting diode includes a transparent electrode layer 69, which includes a different structure from that of the exemplary embodiment described above, on the upper semiconductor layer 27, and micro-lenses 71a covering the transparent electrode layer 69. The LED according to the present exemplary embodiment has substantially the same structure as that of the LED according to the exemplary embodiment of FIGS. 1 and 2 except for the transparent electrode layer 69 and the micro-lenses 71a.

Referring to FIG. 15, the transparent electrode layer 69 includes a convex-concave upper surface composed of concave portions 69a' and convex portions 69b. The concave portion 69a' has a substantially flat upper surface and the convex portion 69b has a substantially trapezoidal cross-section. The convex-concave surface of the transparent electrode layer 69 assists in increasing the surface area for light extraction and reducing total internal reflection to improve light extraction efficiency. Additionally, according to the present exemplary embodiment, a plurality of micro-lenses 71a is provided to achieve further improvement in light extraction efficiency. The micro-lenses 71a are generally formed to cover the concave portions 69a' such that a lower edge region of each of the micro-lenses 71a covers a side surface and a periphery of the convex portion 69b. In the present exemplary embodiment, the concave portion 69a' comprises a hole, which is formed by partially etching the transparent electrode layer 69 in a depth direction to have a blocked periphery and a blocked bottom, that is, a blind hole. At this time, the micro-lenses 71a may be formed to completely cover the blind holes.

The holes 69a and the micro-lenses 71a may be regularly or irregularly disposed on the second conductivity-type upper semiconductor layer 27. The holes 69a may have a micrometer scale diameter (or width), for example, about 6 µm, and a distance between the holes may be about 8 µm. The holes 69a may have a circular or elliptical cross-section. A surface defining the periphery of the hole 69a may include an inclined surface which gradually increases the size of the hole 69a, a reverse-inclined surface, or a vertical surface.

The micro-lenses 71a may have a semi-spherical convex shape to act as a convex lens. The micro-lenses 71a may have a micrometer scale diameter, for example, about 9 µm, in a horizontal direction. The transparent electrode layer 69 may be formed of ZnO or ITO, and the micro-lenses 71a may be formed of a material, for example $SiO_2$, which has a lower refractive index than the transparent electrode layer 69. Although the refractive indices of the transparent electrode layer 69 and/or the micro-lens 71a may be varied according to the refractive index of a material layer adjoining thereto, an ITO layer having a refractive index of 1.7 may be used as the transparent electrode layer and the refractive index of the micro-lenses may be set to be in the range of about 1 to 2.45, when the upper semiconductor layer is a GaN-based semiconductor layer having a refractive index of about 2.45. The micro-lenses may have insulating properties. Alternatively, however, the micro-lenses may be conductive.

Since the transparent electrode layer 69 is formed with the concave portions 69a', such as holes or through-holes (not shown), and the micro-lenses 71a are formed to cover the concave portions 69a', light generated in the active layer 25 may be emitted outside through the micro-lenses 71a, thereby improving light extraction efficiency.

Figure 16:
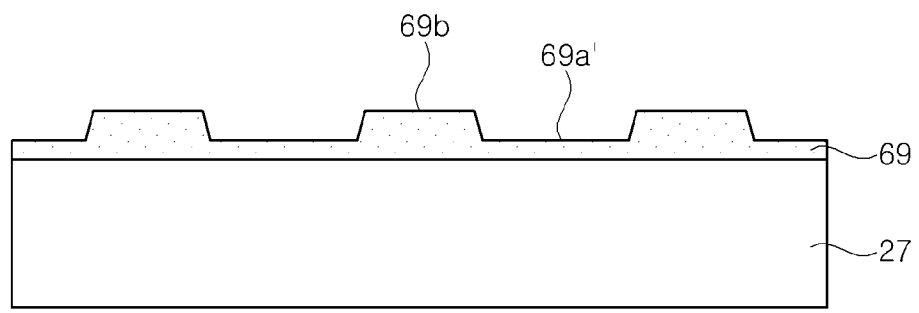
FIGS. 16 and 17 are side-sectional views explaining a process for manufacturing the LED shown in FIG. 13 to FIG. 15.
Figure 17:
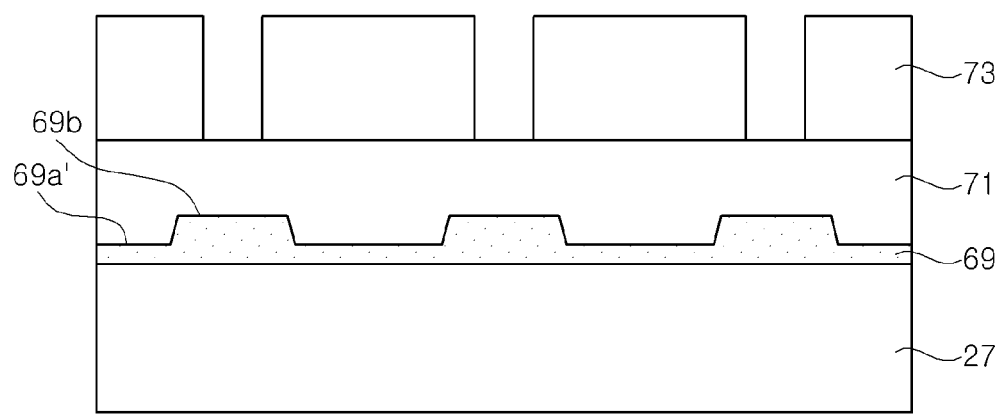

FIGS. 16 and 17 are side-sectional views explaining some processes for manufacturing the LED according to the present exemplary embodiment.

Referring to FIG. 16, the transparent electrode layer 69 is formed of a convex-concave pattern, which includes a concave portion 69a' and a convex portion 69b. The other processes or operations prior to this process are the same as those of the method described above with reference to FIGS. 3 and 4.

Referring again to FIG. 16, the concave portion 69a' is a blind hole, the bottom of which is blocked above the lower semiconductor layer 23. The convex-concave pattern on the transparent electrode layer 69 may be formed by forming the transparent electrode layer 69 on the second conductivity-type upper semiconductor layer 27 and patterning the transparent electrode layer 69 by lithography and etching to form the blind holes. Alternatively, the convex-concave pattern on the transparent electrode layer 69 may be formed by forming a photoresist pattern corresponding to a pattern of the blind holes to be formed thereon and performing a lift-off process.

Referring to FIG. 17, an insulation layer 71, more preferably, a transparent insulation layer, is formed to cover the transparent electrode layer 69. The insulation layer 71 may cover mesa sidewalls and some regions of the first conductivity-type lower semiconductor layer 23 exposed by mesa etching. The insulation layer 71 may be formed of $SiO_2$.

Then, a photoresist pattern 73 is formed on the insulation layer 71. The photoresist pattern 73 covers the insulation layer 71 on the concave portion 69a' and has openings which expose the insulation layer 71 on the transparent electrode layer 69.

Then, the insulation layer 71 is etched by wet etching to form micro-lenses 71a, as shown in FIG. 15. Alternatively, the photoresist pattern 73 may be formed to have lens shapes using a reflow technology and may be used as a mask for dry etching the insulation layer 71 to form the micro-lenses 71a.

Figure 18:
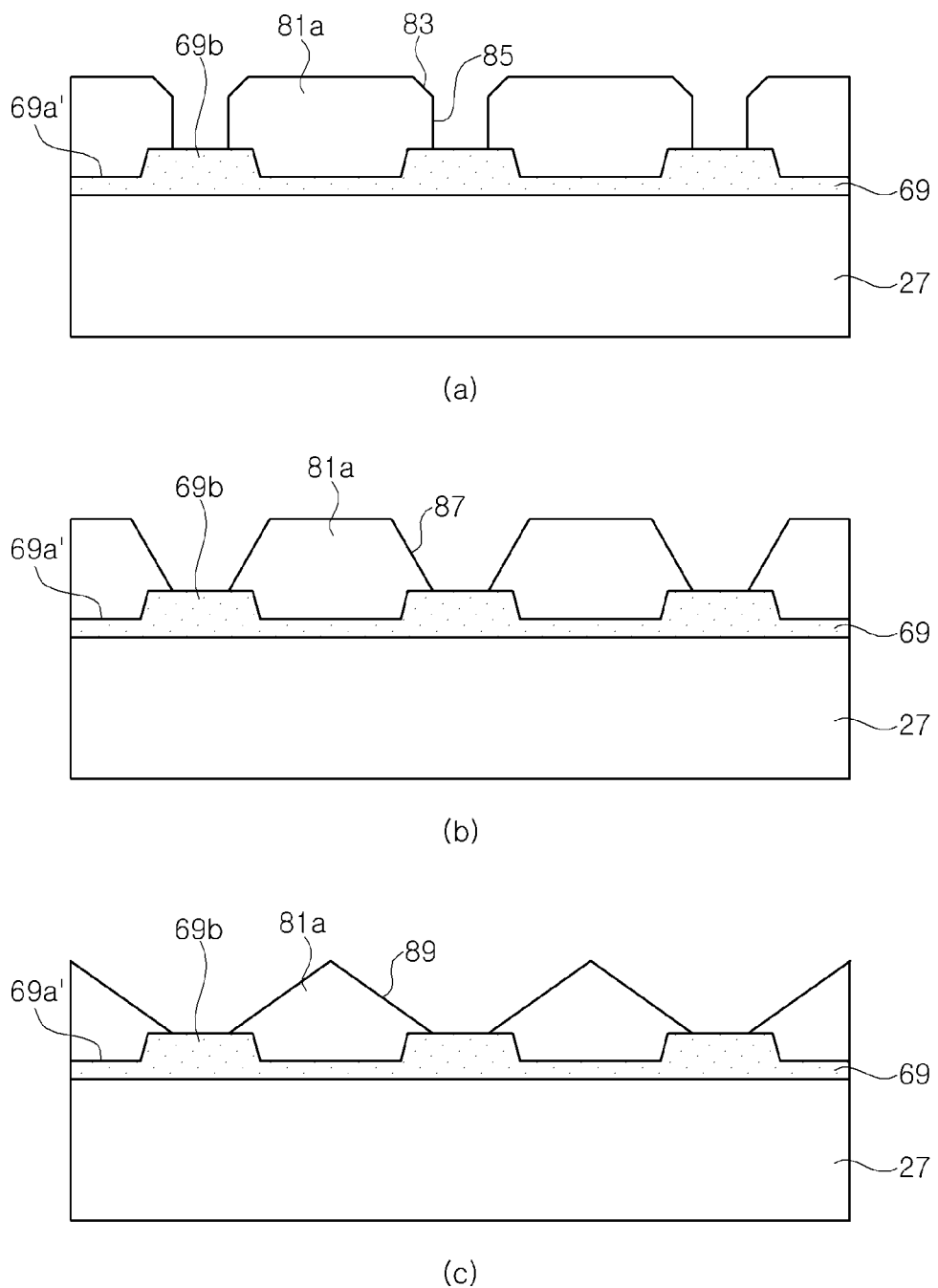
FIGS. 18(a), 18(b), and 18(c) show side-sectional views of various micro-lenses formed on a transparent electrode layer having blind holes, according to exemplary embodiments of the present invention.

FIG. 18 shows side sectional views of various micro-lenses.

Although the micro-lenses 71a on the transparent electrode layer 69 are illustrated as having a vertical cross-section of a convex shape, for example, a circular or elliptical cross-sectional shape, the micro-lenses may have various shapes. These micro-lenses may have a vertical cross section, a width of which gradually decreases upwards, on the transparent electrode layer 69.

Referring to FIG. 18(a), micro-lenses 81a have a vertical cross-section, which includes a flat upper surface and side surfaces, on the transparent electrode layer 69, in which each of the side surfaces may comprise two inclined surfaces 83 and 85. On the side surface of the micro-lens 81a, an obtuse angle may be defined between the inclined surfaces 83 and 85. The inclined surface 85 may extend vertically upwards on the transparent electrode layer 69. Alternatively, the inclined surface 85 may extend upwards from the transparent electrode layer 69 at a more inclined angle than the inclined surface 83.

Further, the side surface of the micro-lens 81a may include more than two inclined surfaces. In addition, at least one of the inclined surfaces 83 or 85 may be a convex surface.

Further, as shown in FIG. 18(b), the micro-lenses 81a may have a flat upper surface and side surfaces, each of which comprises a single inclined surface. In addition, as shown in FIG. 18(c), the micro-lenses 81a may have side surfaces, each of which comprises a single inclined surface and meet other side surfaces to form a pointed end. The single inclined surface of the micro-lens 81a may be a flat surface. Alternatively, the single inclined surface of the micro-lens 81a may be a convex surface.

Further, the micro-lenses 81a may have various shapes as shown in FIG. 12.

According to the exemplary embodiments of the present invention, the light emitting diodes include a single first electrode pad, two second electrode pads, and first and second pad extensions, thereby ensuring uniform current spreading over a wide area of the LED without reducing a light emitting area. In addition, the LED includes a transparent electrode layer having concave portions and convex portions, thereby improving light extraction efficiency through the transparent electrode layer. Moreover, the convex portions on the transparent electrode layer, for example, micro-lenses disposed on holes of the transparent electrode layer, may further improve light extraction efficiency.

Although the invention has been illustrated with reference to some exemplary embodiments in conjunction with the drawings, it will be apparent to those skilled in the art that various modifications and changes can be made in the invention without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention covers the modifications and variations of this invention provided they come within the scope of the appended claims and their equivalents.

What is claimed is:

1. A light emitting diode, comprising:
    a substrate comprising a first side edge and a second side edge;
    a light emitting structure arranged on the substrate, the light emitting structure comprising a first conductivity-type semiconductor layer, an active layer, and a second conductivity-type semiconductor layer;
    a transparent electrode layer arranged on the second conductivity-type semiconductor layer;
    a first electrode pad contacting an upper surface of the first conductivity-type semiconductor layer, the first electrode pad located near a center of the first side edge;
    two second electrode pads located near opposite distal ends of the second side edge, the two second electrode pads to supply electric current to the second conductivity-type semiconductor layer;
    a first pad extension extending from the first electrode pad; and
    a second pad extension extending from each of the two second electrode pads, the second pad extension contacting an upper surface of the transparent electrode layer,
    wherein the first pad extension comprises a first inserting portion extending from the first electrode pad towards the second side edge; and second inserting portions extending from a portion of the first inserting portion between a central region of the first inserting portion and the first electrode pad towards opposite sides of the first inserting portion along the first side edge.

2. The light emitting diode of claim 1, wherein
    the second inserting portions are bent to extend towards the second side edge, and being further bent to extend toward each other and to terminate such that distal ends of the second inserting portions do not contact each other,
    wherein the second pad extension comprises:
        a connecting portion connecting the two second electrode pads to each other therethrough;
        a first inserting portion extending from a central region of the connecting portion towards the first electrode pad;
        second inserting portions extending from a distal end of the first inserting portion along the second side edge, the second inserting portions being bent to surround a distal end of the first pad extension first inserting portion and extending towards the first side edge; and
        a third inserting portion extending from each of the two electrode pads towards the first side edge and being bent to extend towards the first electrode pad along the first side edge.

3. The light emitting diode of claim 2, wherein the first pad extension first inserting portion is collinear with the second pad extension first inserting portion, and each of the second pad extension second inserting portions are respectively located between the first inserting portion and the second inserting portions of the first pad extension.

4. The light emitting diode of claim 1, wherein the transparent electrode layer comprises nanoparticles and an upper transparent electrode layer covering the nanoparticles, and wherein the upper transparent electrode layer comprises a convex-concave surface.

5. The light emitting diode of claim 4, wherein the nanoparticles comprise a rounded surface.

6. The light emitting diode of claim 1, further comprising an insulation layer covering the transparent electrode layer, wherein the insulation layer comprises a convex-concave surface.

7. The light emitting diode of claim 1, further comprising micro-lenses,
    wherein the transparent electrode layer comprises blind holes or through-holes and the micro-lenses are arranged in the holes.

8. The light emitting diode of claim 7, wherein the micro-lenses comprise a material having a lower refractive index than the transparent electrode layer.

9. The light emitting diode of claim 8, wherein the micro-lenses comprise $SiO_2$.

10. The light emitting diode of claim 7, wherein the micro-lenses comprise a vertical cross-section, a width of which gradually decreases in a direction away from the substrate.

11. The light emitting diode of claim 7, wherein the micro-lenses comprise a vertical cross-section, which comprises at least two inclined surfaces with an obtuse angle defined therebetween.

12. The light emitting diode of claim 7, wherein the micro-lenses comprise a horizontal cross-section of a circular shape, an elliptical shape, a hexagonal shape, a rectangular shape, or a triangular shape.

* * * * *